United States Patent
Kitamura et al.

(10) Patent No.: US 7,336,138 B2
(45) Date of Patent: Feb. 26, 2008

(54) EMBEDDED STRUCTURE CIRCUIT FOR VCO AND REGULATOR

(75) Inventors: Tomomitsu Kitamura, Tokyo (JP); Ken Suyama, Hawthorne, NY (US); Aleksander Dec, Hawthorne, NY (US)

(73) Assignees: Renesas Technology Corp., Tokyo (JP); Epoch Microelectronics, Inc., Hawthorne, NY (US)

( * ) Notice: Subject to any disclaimer, the term of this patent is extended or adjusted under 35 U.S.C. 154(b) by 103 days.

(21) Appl. No.: 11/412,973

(22) Filed: Apr. 28, 2006

(65) Prior Publication Data

US 2007/0262825 A1 Nov. 15, 2007

(51) Int. Cl.
*H03B 5/12* (2006.01)
*H03L 1/00* (2006.01)
(52) U.S. Cl. .......... 331/186; 331/117 R; 331/117 FE; 331/176
(58) Field of Classification Search ............ 331/117 R, 331/117 FE, 175–176, 185–186
See application file for complete search history.

(56) References Cited

U.S. PATENT DOCUMENTS 6,362,698 B1* 3/2002 Gupta ................. 331/117 FE

FOREIGN PATENT DOCUMENTS

JP 2001-306157 11/2001

* cited by examiner

*Primary Examiner*—David Mis
(74) *Attorney, Agent, or Firm*—Mattingly, Stanger, Malur & Brundidge, P.C.

(57) ABSTRACT

An oscillation circuit formed in a single semiconductor chip, wherein a first source voltage is supplied to a first power supply terminal, a second source voltage different from the first source voltage is supplied to a second power supply terminal, a voltage regulator receives the voltage from the first power supply terminal and outputs a source voltage, a voltage controlled oscillation circuit is supplied with a source voltage from the voltage regulator, a current source circuit is connected to the second power supply terminal, the voltage regulator, the voltage controlled oscillation circuit and the current source circuit are inserted in series between the first and second power supply terminals, and the current supplied to the voltage controlled oscillation circuit from the voltage regulator flows in the current source circuit.

10 Claims, 9 Drawing Sheets

EMBEDDED STRUCTURE CIRCUIT FOR VCO AND REGULATOR

BACKGROUND OF THE INVENTION

This invention relates to an oscillation circuit and a technique effectively applicable to a voltage controlled oscillation circuit integrated with a power supply circuit or in particular to a technique effectively applicable to a voltage controlled oscillation circuit (hereinafter referred to as the VCO) for generating a radio-frequency local oscillation signal used for down-converting a receiving signal or up-converting a transmission signal.

A radio communication device such as a mobile phone uses a communication semiconductor integrated circuit (hereinafter referred to as the radio-frequency IC) for down-converting or up-converting the frequency by combining the receiving signal or the transmission signal with a radio-frequency local oscillation signal or modulating the transmission signal or demodulating the receiving signal. A radio-frequency IC having a built-in VCO for generating a radio-frequency local oscillation signal to be combined with the received signal or the transmission signal has been proposed.

Generally, the VCO has the frequency dependency in which the oscillation frequency changes with the source voltage. To obviate this problem, a circuit as shown in FIG. 1 is available in which a power supply circuit capable of generating a stable source voltage and a voltage controlled oscillation circuit are integrated with each other to suppress the source voltage variations. The circuit shown in FIG. 1 includes a power supply circuit 10 having a circuit 11 such as a band gap reference circuit for generating a constant voltage and a voltage regulator 12 for generating a voltage corresponding to the constant voltage, and an oscillation circuit 20 oscillated with the voltage from the power supply circuit as a source voltage.

SUMMARY OF THE INVENTION

In the WCDMA radio communication system, the transmit and receive operations are performed at the same time and continuously, and therefore, as compared with the GSM packet communication, consumes a larger amount of power and is considered to require the reduction of power consumption to secure the desired battery survival time. The oscillation circuit shown in FIG. 1 has a power supply circuit 10 for supplying a stable source voltage and therefore a lower source voltage dependency of the oscillation frequency. Nevertheless, the current consumption of the oscillation circuit is increased due to the power supply circuit 10 including the constant voltage circuit 11 and the voltage regulator 12 while at the same time posing the problem of the noise generated by the power supply circuit 10.

The noise of the power supply circuit has a serious effect on the phase noise of VCO and therefore poses a critical problem. A technique using a bypass capacitor is available as a method of reducing the noises of the power supply circuit. It is difficult, however, to embed the bypass capacitor in the IC chip due to the large capacitance thereof. The provision of a bypass capacitor as an external device, on the other hand, requires the IC chip additional connecting terminals. This increases the number of pins and hence the package size, resulting in an increased number of the required parts, thereby hampering the system size reduction. Therefore, the use of the bypass capacitor is not a proper measure.

In view of this, the inventor has conceived and studied a circuit shown in FIG. 2, in which a power control transistor M0, a level-up transistor Q0 and a constant voltage circuit 11 are stacked vertically as a power supply circuit for an oscillation circuit.

In the power supply circuit shown in FIG. 2, the reduction in the resistance value of the circuit seems to be an idea to reduce the noises of the power supply circuit. In proportion to reducing the resistance value, however, the current consumption is increased. In the radio-frequency IC for the mobile phone of WCDMA type, the reduced current consumption of the built-in VCO is important. Unless the current consumption of the attached power supply circuit is also reduced as far as possible, however, the specification requirement cannot be met. For this reason, the power supply circuit shown in FIG. 2 has proved to be still insufficient to reduce the current consumption.

As an invention related to the present invention, a configuration has been proposed in which a VCO circuit and a mixer circuit are stacked vertically between a voltage source terminal and a grounding point (JP-A-2001-306157). In this prior art, though similar to the present invention in that circuits having different functions are stacked vertically between a source voltage terminal and a grounding point, a circuit having the intended function and the power supply circuit are not vertically stacked.

Also, the cited prior art includes a switch for switching the VCO circuit and the mixer circuit between vertical and parallel arrangements to permit the circuit operation even in the case where the battery is consumed. The prior art, therefore, is apparently different in configuration and operation from the present invention which always operates with the VCO circuit and the power supply circuit stacked vertically.

An object of this invention is to provide an oscillation circuit in which noises generated from the power supply circuit are minimized and a smaller amount of current is consumed while at the same time reducing the chip size.

Another object of this invention is to provide an oscillation circuit suitably built in the radio-frequency IC for a mobile phone.

Representative points of this invention are briefly described below.

Specifically, in a power supply circuit shown in FIG. 2 in which a voltage control transistor, level-up transistor and a band gap reference circuit are stacked vertically between a source voltage terminal and a grounding point, a VCO (voltage controlled oscillation circuit) constituting a function circuit is inserted in place of the level-up transistor.

In this circuit configuration, the band gap reference circuit and the voltage regulator can share voltage-dividing resistors (designated by R7, R8, R9 and R11, R12 in FIG. 1) and feedback differential amplifiers (AMP0, AMP1). As compared with the conventional circuit, therefore, the current consumption can be reduced remarkably while at the same time reducing the area occupied by the circuit, i.e. the chip size.

Also, the current flowing in the power supply circuit acts as an operating current for the oscillation circuit. As long as the total current remains the same as that of the circuit of FIG. 2 in which currents flow individually, therefore, the noises can be reduced by reducing the resistance value of the power supply circuit and increasing the current flowing therein. As a result, the noises can be reduced without using a bypass capacitor. At the same time, the increased package size, the increased number of parts and the resulting increased cost and the increased package area due to the addition of an external terminal can be avoided.

The representative advantages disclosed by the invention are briefly described below.

Specifically, according to this invention, there is provided an oscillation circuit, in which less noises are generated and a less current is consumed, while at the same time reducing the chip and package sizes and which can be suitably built in the radio-frequency IC for the mobile phones.

The above and other objects, features and advantages will be made apparent by the detailed description taken in conjunction with the accompanying drawings.

DESCRIPTION OF THE EMBODIMENTS

Preferred embodiments of the invention are explained below with reference to the drawings.

Figure 3:
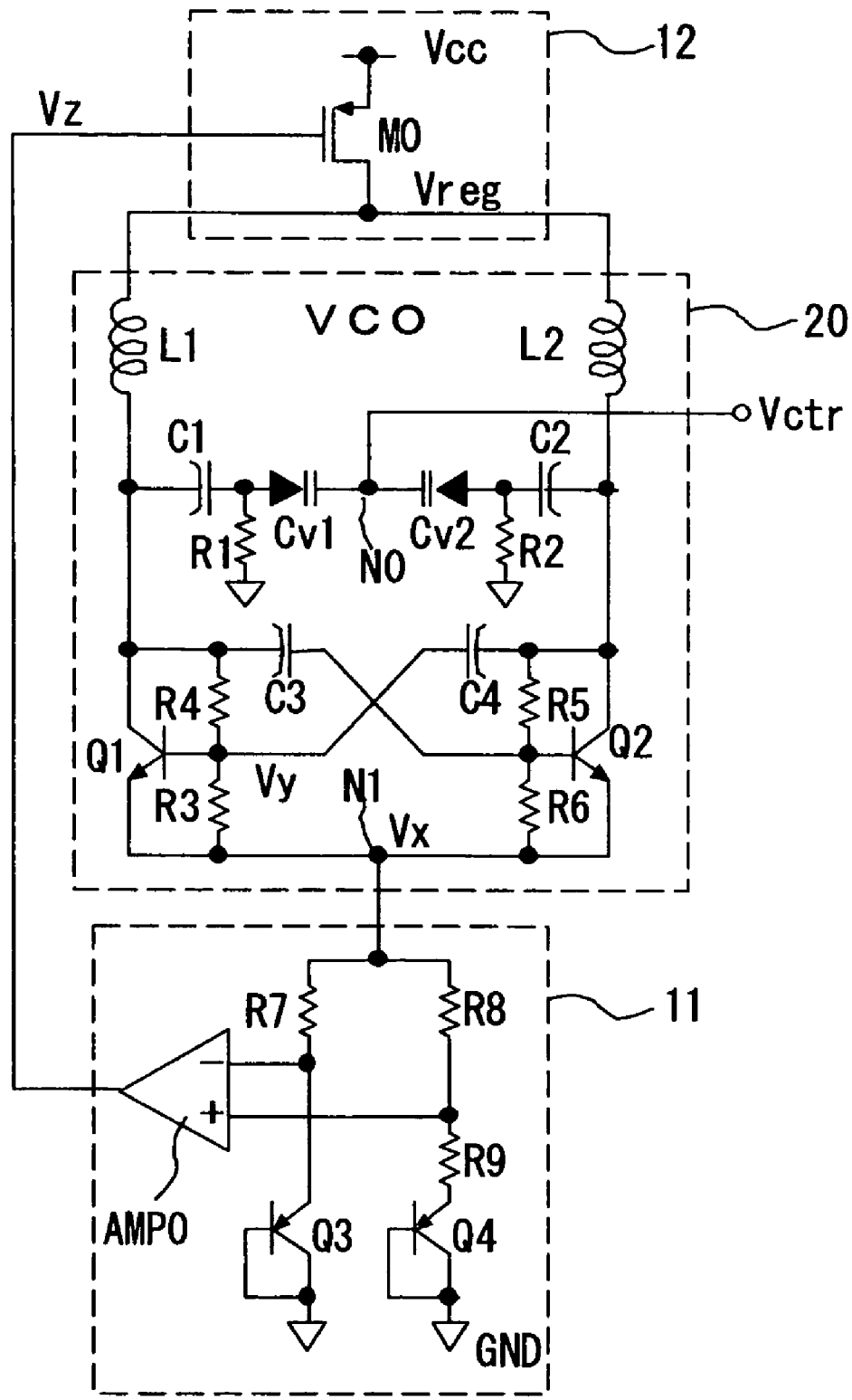
FIG. 3 is a circuit diagram showing a power supply-integrated oscillation circuit according to a first embodiment of the invention.

FIG. 3 shows an oscillation circuit according to an embodiment of the invention.

In the oscillation circuit according to this embodiment, a power control transistor M0, a voltage controlled oscillation circuit (VCO) 20 and a band gap reference circuit (hereinafter referred to as the band gap circuit) 11 constituting a constant voltage circuit are connected in series and stacked vertically between a source voltage terminal Vcc and a grounding point GND. In order to stabilize a reference voltage Vx, the gate terminal of the power control transistor M0 is impressed with a control voltage Vz output from the band gap circuit 11.

The VCO 20 is a LC resonance-type oscillation circuit having a pair of NPN bipolar transistors Q1, Q2 having a common source with bases and the collectors cross-connected through capacitors C3, C4. Also, the VCO 20 includes inductors L1, L2 connected between the collectors of the transistors Q1, Q2 and the source voltage terminal Vcc and variable capacitors Cv1, Cv2 constituting varactor diodes connected in series between the collectors of the transistors Q1, Q2.

The varactor diodes Cv1, Cv2 are connected with the cathode terminals thereof in opposed relation to each other.

Also, as a measure against the pushing (power supply voltage variations) characteristic, resistors R1, R2 are connected between the anode terminals of the varactor diodes Cv1, Cv2 and the grounding point GND, and capacitors C1, C2 for cutting the DC component are connected in series to the variable capacitors Cv1, Cv2 for conversion to GND level. The connecting node NO of the variable capacitors Cv1, Cv2 is impressed with a control voltage Vctr from a loop filter, etc. in a PLL circuit not shown so that the oscillation frequency can be changed continuously.

Also, resistors R3, R4 and R5, R6 are connected between base and collector and between base and common emitter N1, respectively, of the transistors Q1, Q2 of the VCO 20. In this way, the self biasing is effected by resistance division on the one hand and the level of the regulator voltage Vreg providing a power supply voltage of VCO is adjusted by resistance ratio as described later on the other hand. The capacitors C3, C4 attenuate the oscillation amplitude by the capacitance and the result is positively fed back to the bases of the transistors Q1, Q2. Though not shown, the oscillation output is obtained from the connection node between the collectors of the transistors Q1, Q2 and the inductors L1, L2.

The band gap circuit 11 includes a resistor R7 and a transistor Q3 connected in series between the node N1 connected with the common emitter of the transistors Q1, Q2 of the VCO 20 and the grounding point GND, resistors R8, R9 and a transistor Q4 connected in series between the node N1 and the grounding point GND in parallel to the series-connected resistor R7 and transistor Q3, and a differential amplifier (output comparison differential amplifier) circuit AMP0 supplied with the terminal voltages of the resistors R7, R8 as an input potential.

The transistors Q3, Q4 are PNP bipolar transistors each having the base and the collector connected to each other and set to the same potential. The transistors Q3, Q4 may be formed by the normal bipolar process or PNP transistors of lateral structure formed by the MOS process.

The band gap circuit 11 is connected between the common emitter of the transistors Q1, Q2 of the VCO 20 and the grounding point GND, and outputs a control voltage Vz corresponding to the difference between the base-emitter voltages Vbe3, Vbe4 of the transistors Q3, Q4 and the resistance ratio between the resistors R7, R8, while at the same time functioning as a constant current source for supplying the current free of the power supply voltage dependency to the VCO 20.

According to this embodiment, the control voltage Vz generated by the band gap circuit 11 is applied to the gate terminal of the power supply control transistor M0. As a result, the current corresponding to Vz flows to the transistor M0 and then to the VCO 20 as an operating current. Further, this current flows through the resistors R7, R8 of the band gap circuit 11 in the division ratio of the resistors R7, R8. Generally, the VCO 20 can be oscillated in stable fashion in the case where the regulator voltage Vreg supplied to the VCO 20 by the power supply control transistor M0, depending on the constant of the element used, is not less than 2.4 V.

Figure 1:
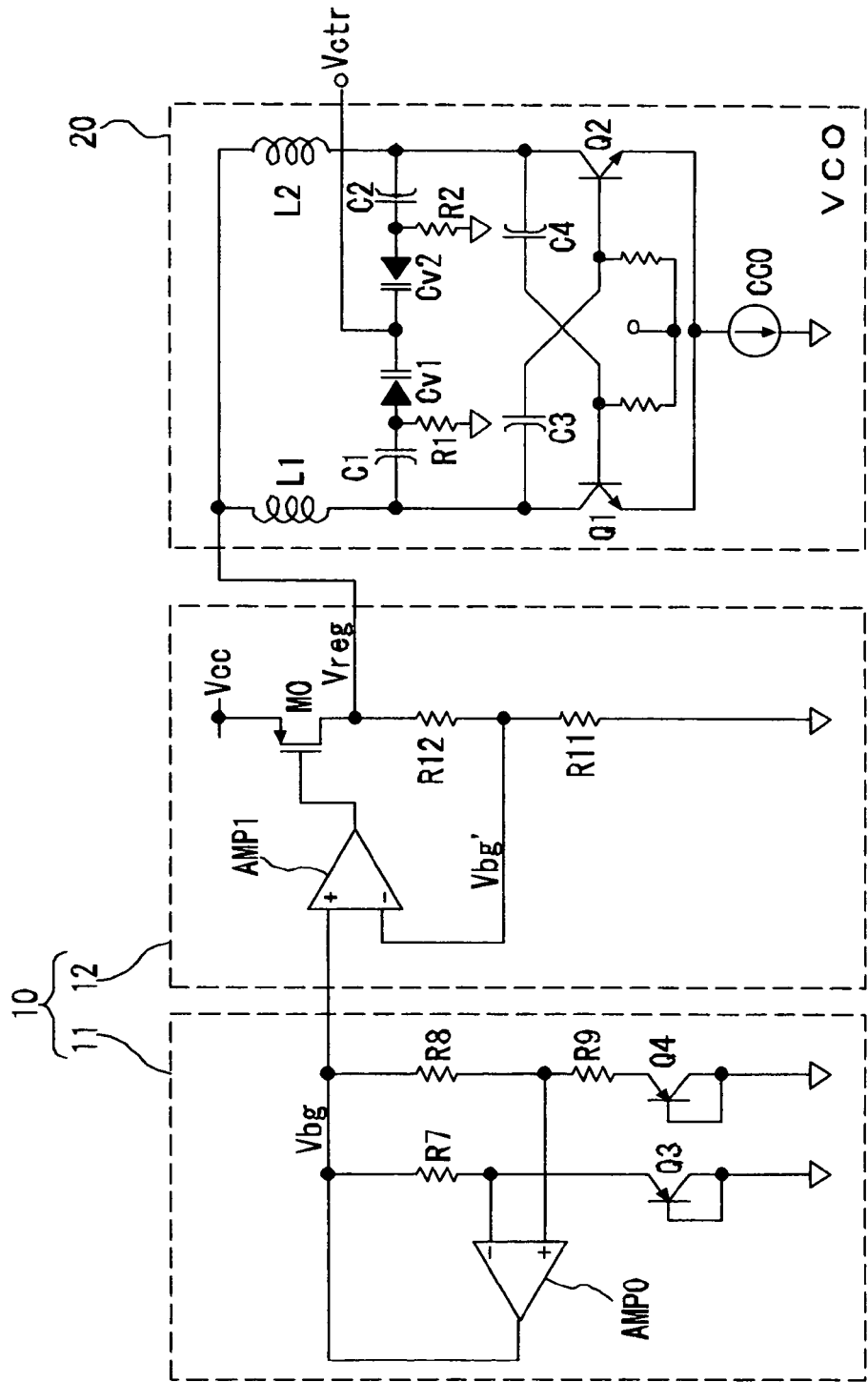
FIG. 1 is a circuit diagram showing an example of the configuration of the conventional oscillation circuit.

In the power supply-integrated oscillation circuit according to this embodiment, the LC resonance circuit for determining the oscillation frequency of the VCO 20 remains the same as that of the VCO shown in FIG. 1, and therefore the AC oscillation operation is identical with that of the conventional VCO. Thus, the frequency f is determined as $f=\frac{1}{2}(\pi^* \sqrt{L^*Cv})$. In view of the fact that the base bias potential of the transistors Q1, Q2 is set higher than that of the conventional VCO to generate the regulator voltage, however, the output amplitude is limited to a somewhat lower level than in the prior art, although this poses substantially no problem in the case where the oscillation amplitude is comparatively small.

On the other hand, the transconductance (Gm) of the transistors Q1, Q2 has a negative temperature coefficient. The bias current of the transistors Q1, Q2 is changed to PTAT (proportional to absolute temperature) current having a positive temperature coefficient of the band gap circuit. Thus, the transconductance Gm of the transistors Q1, Q2 is temperature-compensated and therefore kept constant against the change of the negative resistance (1/Gm) of the oscillator with temperature. As a result, the oscillation amplitude level is stabilized against temperature change. Further, the oscillation amplitude level is corrected, i.e. the amplitude is not reduced by the temperature change. Thus, the phase noise and the SN ratio (signal-to-noise ratio) are improved.

Now, consider the VCO 20 in FIG. 3. The inductors L1, L2 connected in series to the transistors Q1, Q2 are regarded to be zero in resistance in DC current, i.e. the collectors of the transistors Q1, Q2 are regarded to be connected directly to the drain of the power supply control transistor M0. Thus, the transistors Q1, Q2 of the VCO 20 shown in FIG. 3 are considered to be equivalent to the transistor Q0 in the circuit of FIG. 2.

Also, the band gap circuit 11 functions as a constant current source for supplying a current free of power supply voltage dependency to the VCO 20. The band gap circuit 11 shown in FIG. 3, therefore, can be regarded as a circuit equivalent to the constant current source CC0 in the circuit of FIG. 2. Specifically, the circuit of FIG. 3 operates similarly to the power supply circuit for supplying a power supply voltage of the VCO in FIG. 2. By analyzing the regulator voltage Vreg generated by the power supply circuit shown in FIG. 2, therefore, the same result is obtained as if the power supply voltage of the VCO 20 in the embodiment shown in FIG. 3 is analyzed. In view of this, the regulator voltage Vreg generated by the power supply circuit in FIG. 2 is explained below.

Figure 2:
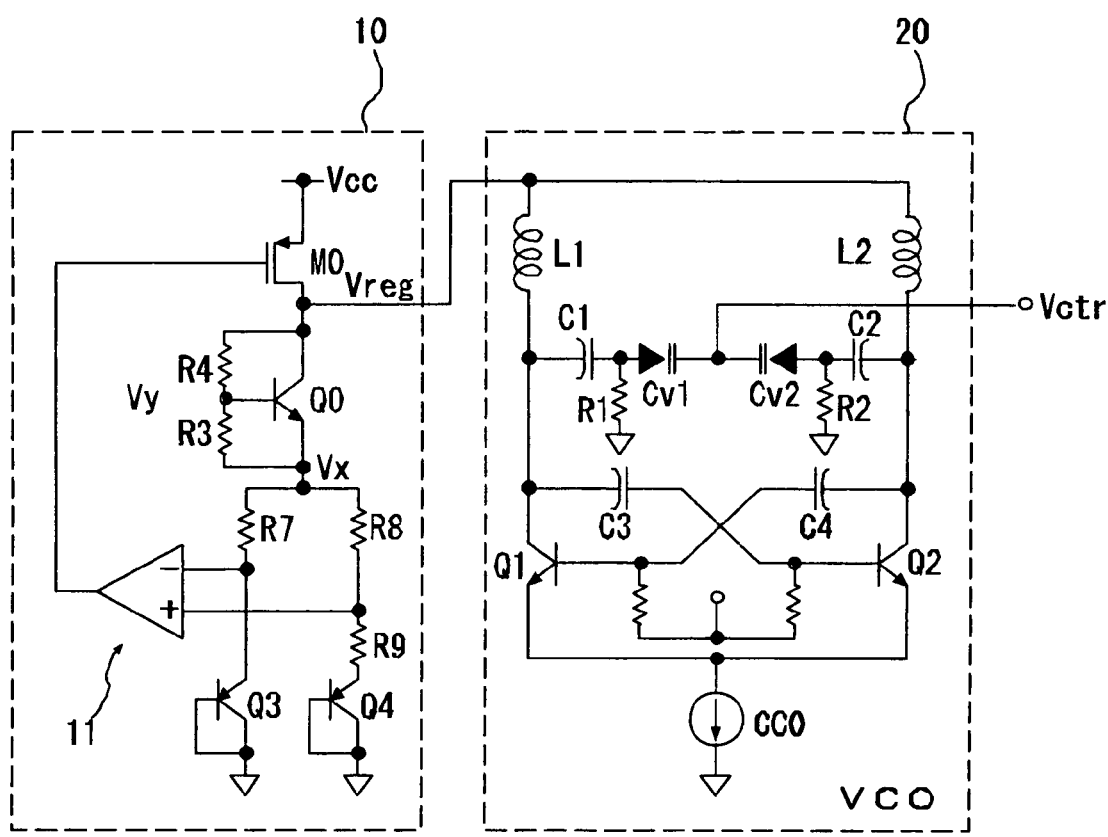
FIG. 2 is a circuit diagram showing an example of the configuration of an oscillation circuit studied by present inventors.

In the power supply circuit 10 shown in FIG. 2, the regulator voltage Vreg is obtained by shifting the reference voltage Vx providing the potential at the common terminal of the resistors R7, R8 of the band gap circuit 11 upward by an amount equal to the base-emitter voltage Vbe(Q0) of the transistor Q0. The base-emitter voltage Vbe(Q0) of the transistor Q0 has a negative temperature coefficient of −2 mV/deg. In the case where a diode-connected transistor with the base and the collector thereof connected to each other is used as the transistor Q0 and the reference voltage Vx is shifted by Vbe(Q0) with the band gap voltage of 1.2 V, therefore, the negative temperature coefficient of the regulator voltage Vreg remains.

Figure 4:
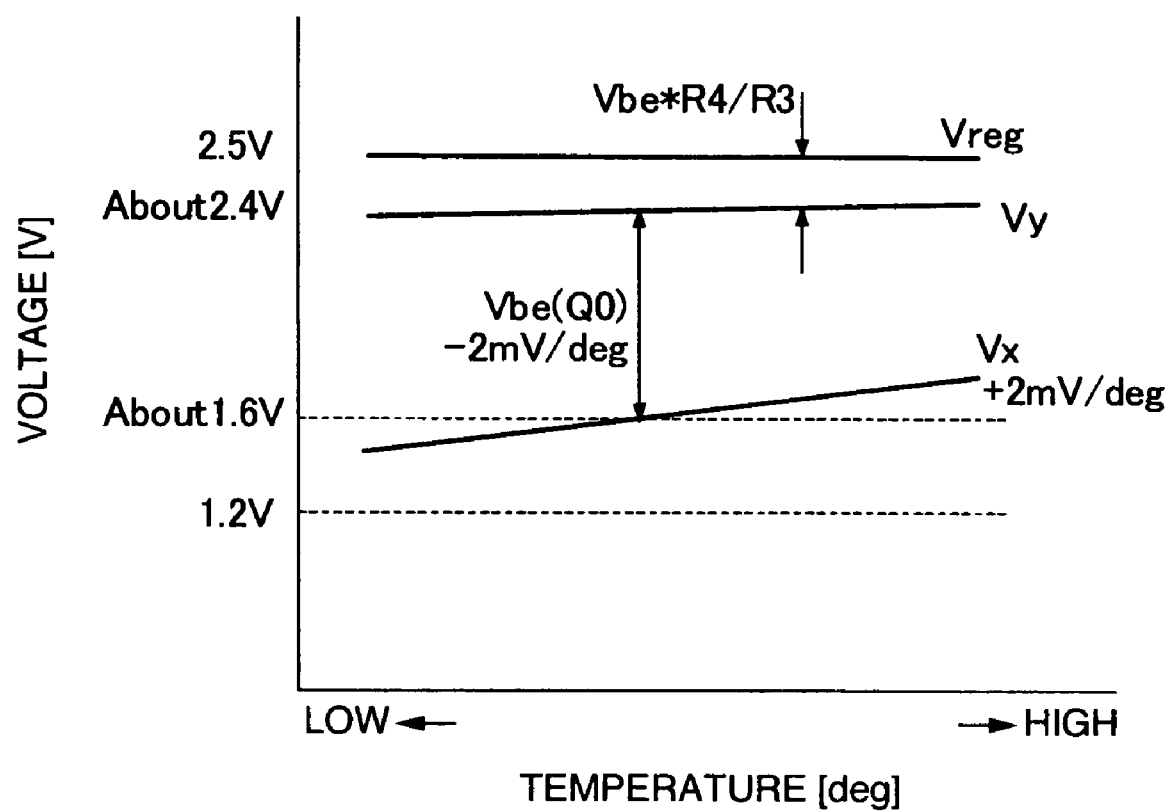
FIG. 4 is a graph showing the temperature characteristic for the potential at each point of the oscillation circuit according to the first embodiment.

Thus, the resistors R7, R8 are adjusted so that the reference voltage Vx may have a positive temperature coefficient as shown in FIG. 4. In the original band gap circuit shown in FIG. 1, the band gap voltage Vx is increased through the resistors R7, R8 by the PTAT current having a positive temperature coefficient. At the same time, the negative temperature coefficient of the base-emitter voltage (Vbe) of the transistors Q3, Q4 is canceled. By increasing the resistors R7, R8 and thus increasing the distribution of the voltage boosted by the PTAT current, the reference voltage Vx can be set to have a positive temperature coefficient of +2 mV/deg.

The circuit of FIG. 2 can be set as described above, and by doing so, the regulator voltage Vreg free of temperature dependency can be generated by canceling the temperature coefficient of the base-emitter voltage Vbe(Q0) of the transistor Q0. Further, in the power supply circuit shown in FIG. 2, the resistors R3, R4 are inserted between base and collector and between base and emitter, respectively, of the transistor Q0 for voltage adjustment, and the voltage is shifted to a still higher level by (R4/R3)*Vbe(Q0) through these resistors. Finally, the regulator voltage Vreg is given as $$Vreg = Vx + Vbe(Q0) + (R4/R3) * Vbe(Q0)$$
$$= Vx + \{(R3 + R4)/R3\} * Vbe(Q0)$$

The temperature coefficient of the voltage Vbe(Q0) is increased in accordance with the ratio between the resistors R3 and R4, and therefore the temperature coefficient of the reference voltage Vx is required to be further adjusted.

According to the embodiment shown in FIG. 3, the reference voltage Vx is set to have a positive temperature coefficient by the resistors R7, R8 of the band gap circuit 11, and the power supply voltage Vreg of the VCO is kept unchanged against the temperature change by canceling the negative temperature coefficient of the base-emitter voltage of the transistors Q1, Q2 of the VCO 20. Also, the ratio between the self-bias resistors R3, R4 and R5, R6 connected to the bases of the transistors Q1, Q2 is set in such a manner as to set the power supply voltage Vreg of the VCO 20 at the desired level. In accordance with this resistance ratio, the resistors R7, R8 of the band gap circuit 11 is further adjusted.

Figure 5:
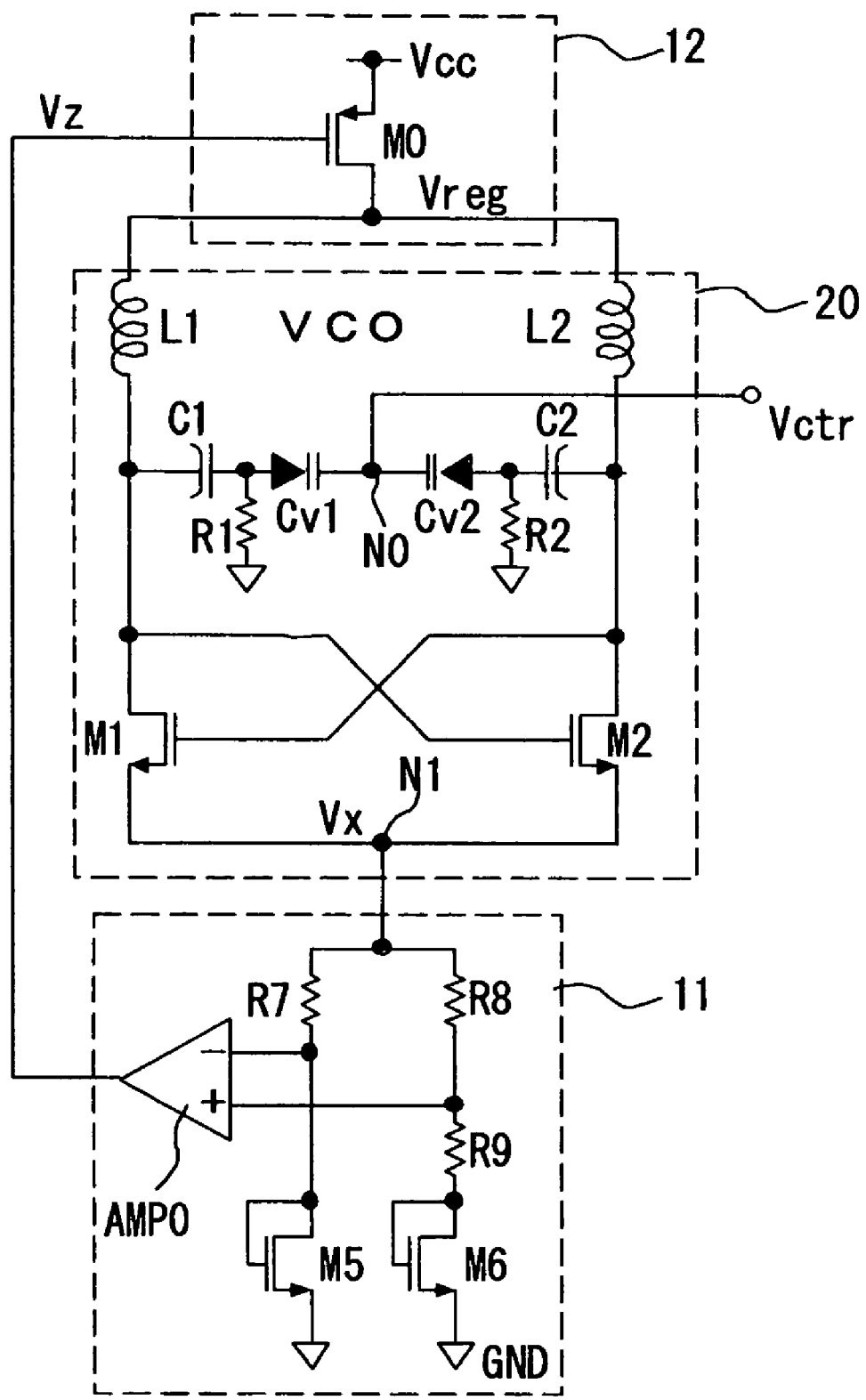
FIG. 5 is a circuit diagram showing an oscillation circuit according to a first modification of the first embodiment.
Figure 6:
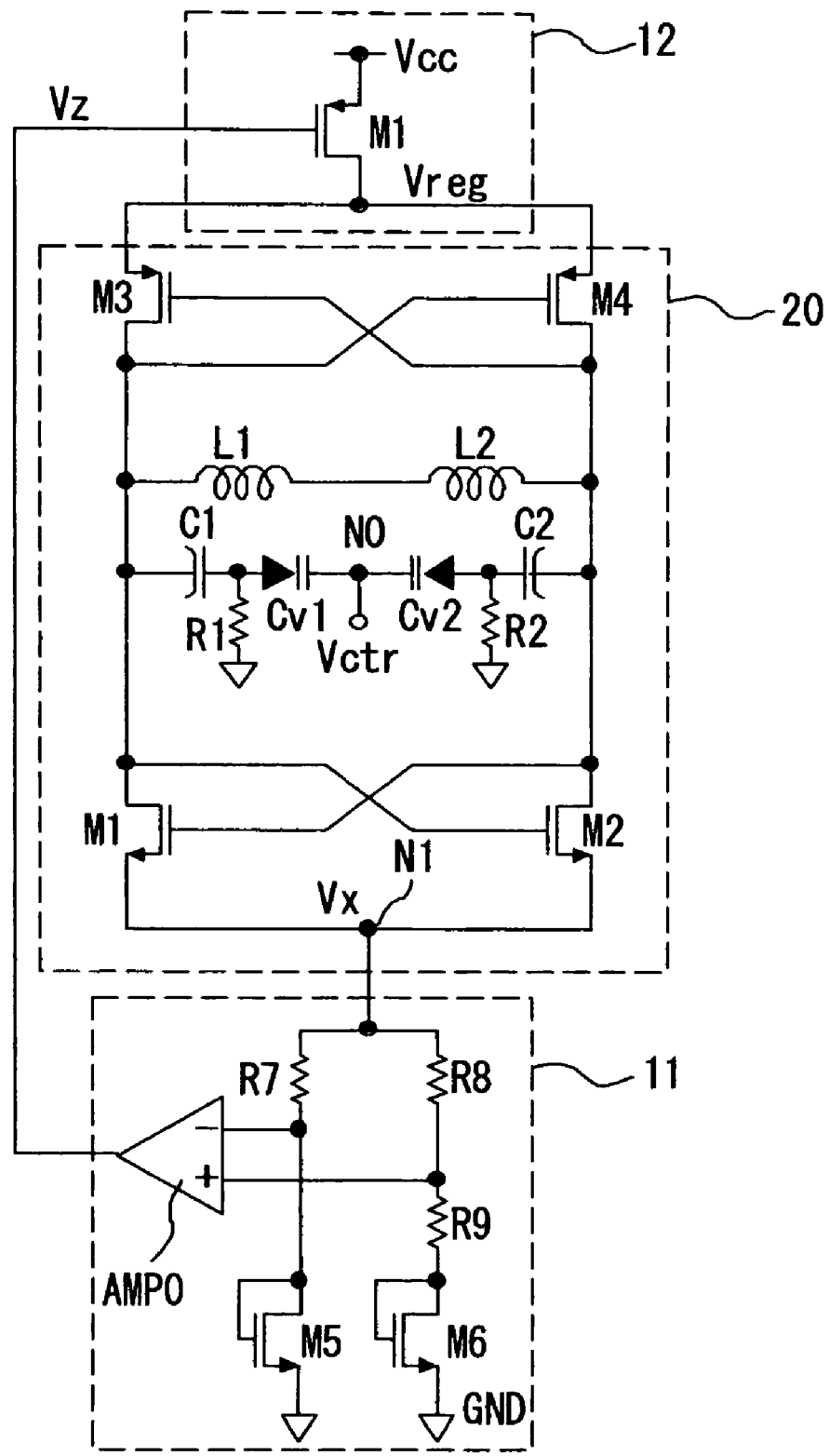
FIG. 6 is a circuit diagram showing an oscillation circuit according to a second modification of the first embodiment.

FIGS. 5, 6 show modifications of the power supply-integrated oscillation circuit according to the embodiment of FIG. 3. FIG. 5 shows a case in which MOSFETs (metal oxide semiconductor field effect transistors) are used in place of the bipolar transistors as the transistors Q1, Q2 of the VCO 20 and the transistors Q3, Q4 of the band gap circuit 11.

According to these modifications, the gate-source voltage Vgs of the MOSFETs (M1, M2) is incorporated in place of the voltage Vbe of the bipolar transistor as a system for generating the regulator voltage in DC fashion. As a result, the regulator voltage Vreg expressed as $$Vreg = Vgs + Vx$$

is generated. The voltage Vgs can be set arbitrarily by size adjustment of the transistors. Also, the temperature dependency of the voltage Vgs can be canceled by setting the reference voltage Vx, and by supplying the PTAT current of the band gap circuit 11 to the VCO 20, a similar effect to the third embodiment of FIG. 3 is expected.

According to the modification shown in FIG. 6, the circuit shown in FIG. 5 is so configured that the inductors L1, L2 of the VCO are not connected in series to the transistors M1, M2 but in parallel to the varactor diodes Cv1, Cv2 between the differential output nodes with the intermediate node floating. Also, a pair of P-channel MOSFETs M3, M4 with the gate terminals and the drain terminals thereof cross-connected are connected in series to N-channel MOSFETs M1, M2 to make up a VCO of CMOS configuration. In this circuit, the regulator voltage Vreg expressed below is generated.

$$Vreg = Vgsn(M1) + Vgsp(M3) + Vx$$

The DC bias is determined by the gate-source potential Vgsn of the NMOSs (M1, M2) and the gate-source potential Vgsp of the PMOSs (M3, M4), and can be arbitrarily adjusted in accordance with the transistor size. Thus, the temperature coefficient can be canceled by the reference voltage Vx. By supplying the PTAT current to the band gap circuit 11 of the VCO 20, a similar effect to the embodiment shown in FIG. 3 is expected. Further, the VCO of the CMOS configuration according to this embodiment, though somewhat limited downward in oscillation amplitude as compared with the VCO of the NMOS configuration, operates with a comparatively small bias current and therefore is suitable for lower power consumption.

Figure 7:
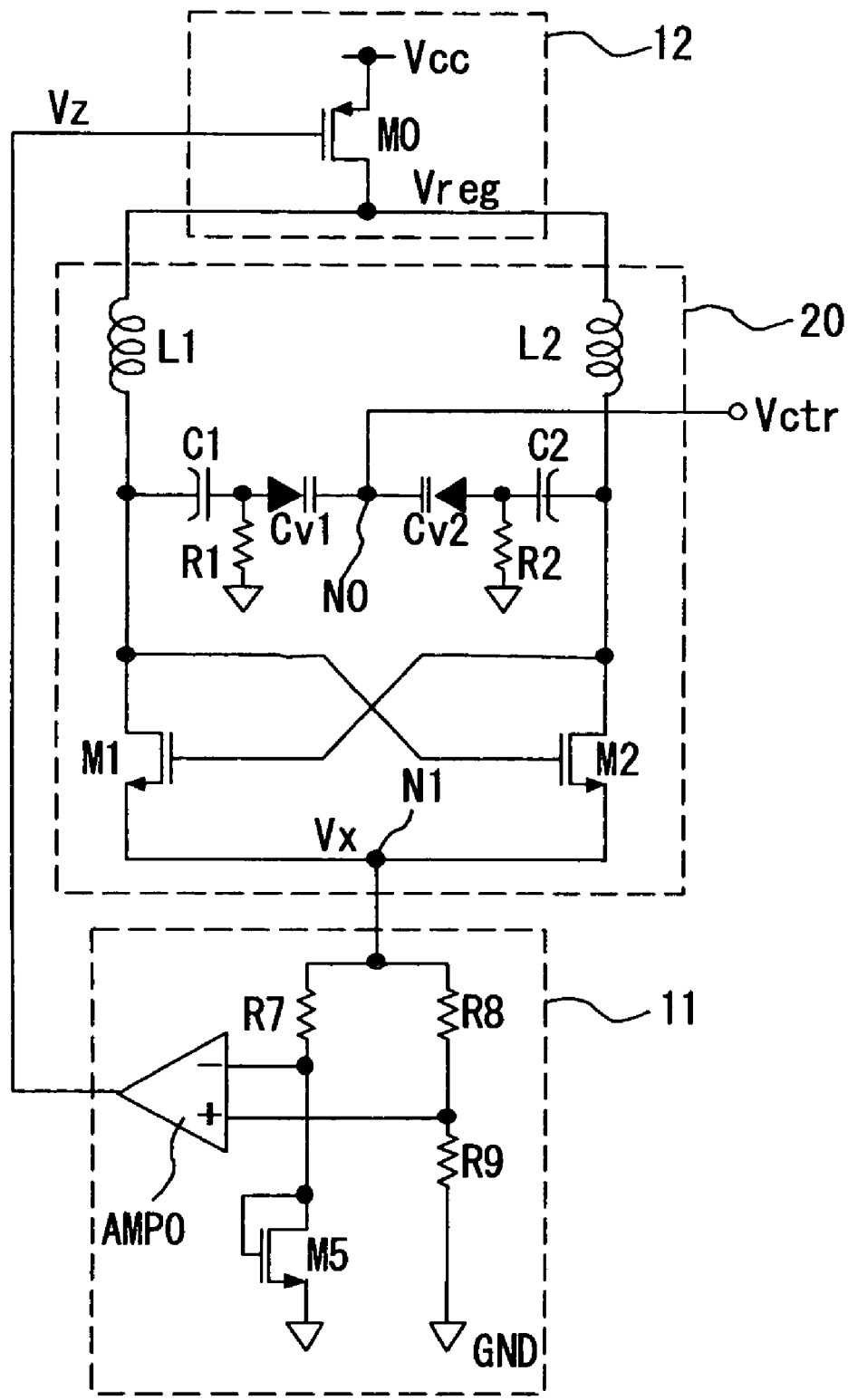
FIG. 7 is a circuit diagram showing an oscillation circuit according to a second embodiment of the invention.

FIG. 7 shows a power supply-integrated oscillation circuit according to a second embodiment of the invention. In this embodiment, a VGS/R bias-type current source circuit without the transistor Q4 (M6) in series with the resistors R8, R9 is used in place of the band gap circuit as a current source circuit.

In the band gap circuit 11 according to the first embodiment, as described above, the negative temperature coefficient of the base-emitter (Vbe) of the transistor Q4 is canceled by the positive temperature coefficient of the resistors R7, R8. According to the second embodiment, on the other hand, the bias current is determined by Vgs(M5)/R9 and has a negative temperature coefficient.

Also, the VGS/R bias-type current source circuit according to this embodiment generates a smaller noise than the band gap circuit, and therefore, though more suitable for the low noise circuit than the first embodiment, requires another correction to secure stability against temperature. Incidentally, the transistor M5 may be a bipolar transistor instead of the MOSFET.

Figure 8:
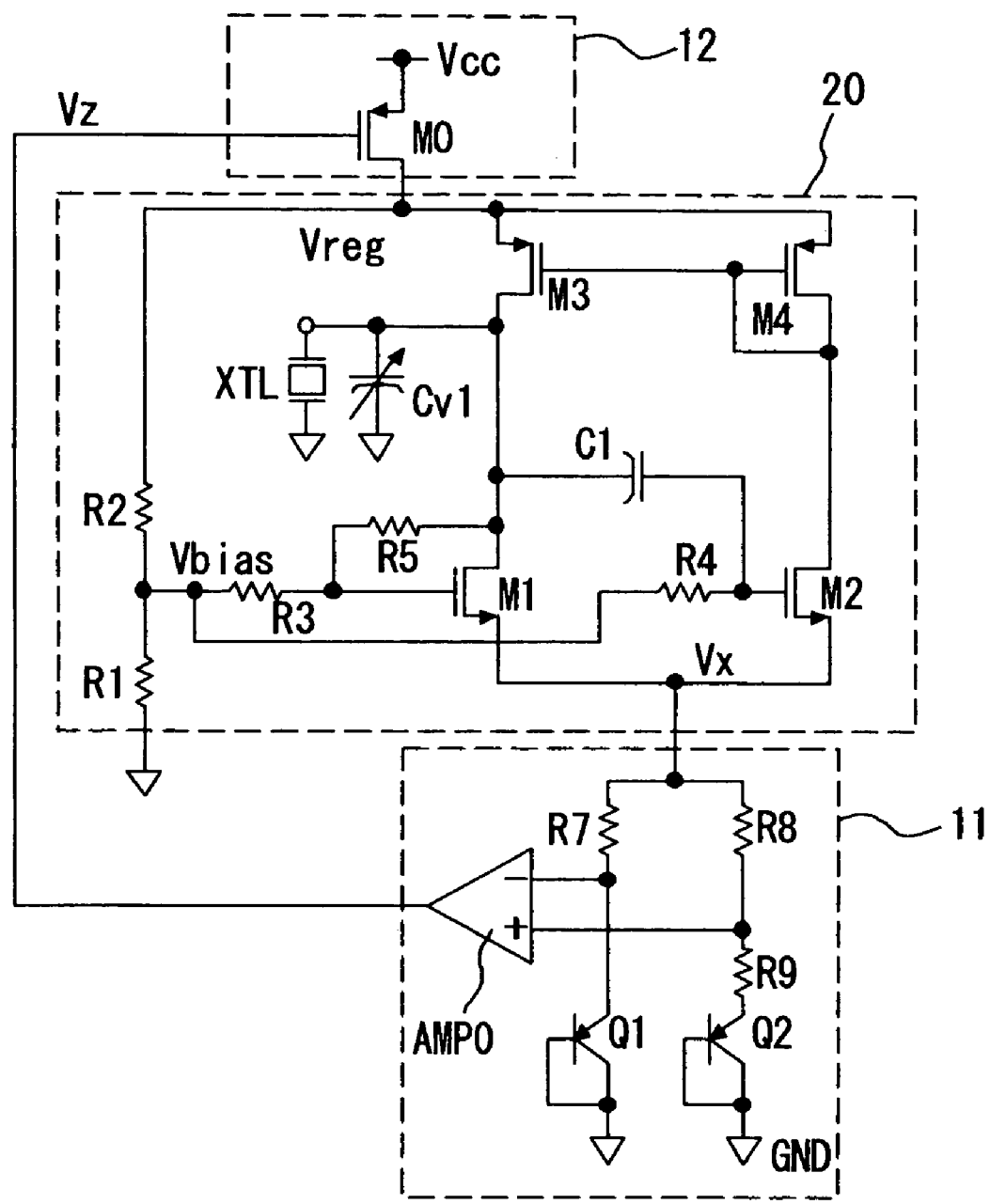
FIG. 8 is a circuit diagram showing an oscillation circuit according to a third embodiment of the invention.

FIG. 8 shows a power supply-integrated oscillation circuit according to a third embodiment of the invention. Although the first and second embodiments described above use a LC resonance-type oscillator of differential configuration as a VCO. Nevertheless, the applicable VCO is not limited to such a type.

According to the third embodiment, the resonance unit of the VCO includes a quartz resonator XTL and a variable capacitor Cv1 for frequency regulation. The transistors M1, M2 having a negative resistance are biased by the voltage Vbias as a division of the regulator voltage Vreg through the resistors R1 to R4. Also, the P-channel load MOSFETs M3, M4 are connected in series to transistors M1, M2 in current-mirror connection. The quartz resonator XTL is connected to an external terminal of a semiconductor chip formed with an oscillation circuit as an external part.

A resistor R5 connected between gate and drain of the transistor M1 has the output thereof negatively fed back to the bias voltage Vbias of the transistor M1. The capacitor C1 connected between the gate of the transistor M2 and the drain of the transistor M1 is used as a positive feedback in AC signal, and the signal returned by the MOSFETs M3, M4 is oscillated over the negative feedback by the resistor R5.

As a power supply circuit of the quartz resonator, like in the first embodiment, a power supply circuit including the band gap circuit 11 and the power supply control transistor M0 is used. The regulator voltage Vreg generated in DC fashion by this power supply circuit is given as $$Vreg=\{(R1+R2)/R1\}\cdot\{Vgs(M1)+Vx\}$$

By setting the reference voltage Vx in such a manner as to cancel the temperature dependency of the gate-source voltage Vgs of the MOSFET, the regulator voltage is stabilized against temperature. Also, the PTAT current of the band gap circuit has the function of correcting the transconductance (Gm) of the transistor M1 against temperature, and therefore the oscillation level is advantageously stabilized.

Figure 9:
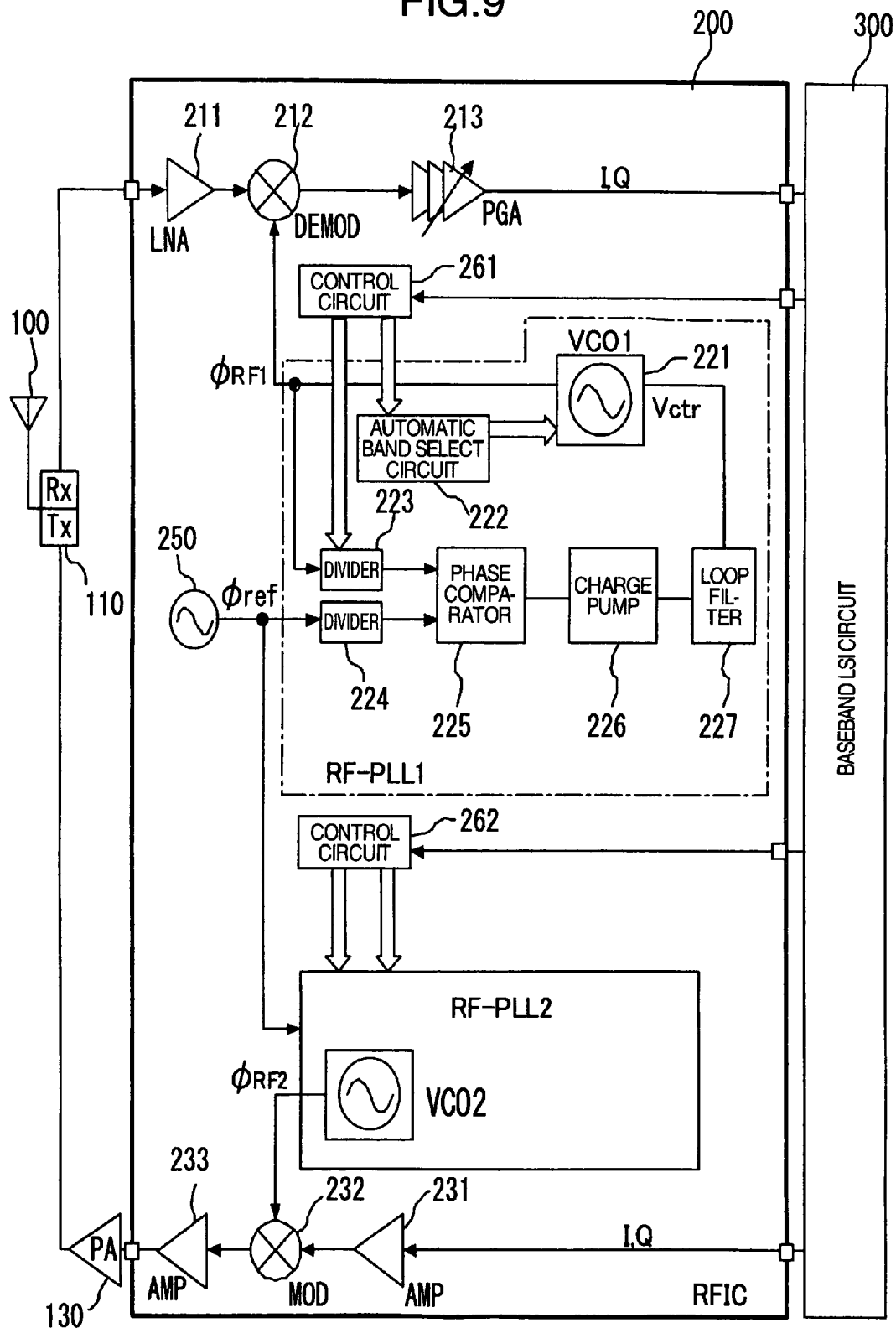
FIG. 9 is a block diagram showing an example of the configuration of a communication semiconductor integrated circuit (radio-frequency IC) using a PLL circuit and a radio communication system using the radio-frequency IC according to this invention.

FIG. 9 is a block diagram showing an example of the configuration of a mobile phone of WCDMA (wideband code division multiple access) type as an example of a communication semiconductor integrated circuit (radio-frequency IC) and a radio communication system using the radio frequency IC employing the oscillation circuit according to this invention.

The system shown in FIG. 9 includes an antenna 100 for transmitting/receiving a signal radio wave, a duplexer (branching filter) 110 for separating the transmission signal and the receiving signal, a radio-frequency power amplifier circuit 130 for amplifying the transmission signal, a radio-frequency IC 200 for demodulating the receiving signal and modulating the transmission signal, and a baseband circuit 300.

The baseband circuit 300 performs the baseband signal processing such as the conversion of the transmission data into I, Q signals, the extraction of the receiving data from the demodulated I, Q signals or the control of the radio-frequency IC 200. According to this embodiment, the radio-frequency IC 200 and the baseband circuit 300 are each configured as a semiconductor integrated circuit mounted on an independent semiconductor chip.

The radio-frequency IC 200 according to this embodiment can be roughly divided into a receiving system circuit, a transmission system circuit, and a control system circuit including circuit units shared by the transmission and receiving systems such as control circuits and clock system circuits.

The receiving system circuit includes a low-noise amplifier 211 for amplifying the receiving signal, a mixer 212 for performing the demodulation and the down-conversion by combining the oscillation signal φRF1 generated by the oscillation circuit VCO 1 and the receiving signal amplified by the low-noise amplifier 211, and a high-gain amplifier (PGA) 213 for amplifying and outputting the demodulated I, Q signals to the baseband circuit 300.

The transmission system circuit includes an amplifier 231 for amplifying the I, Q signals supplied from the baseband circuit 300, a mixer 232 for performing the modulation and up-conversion by combining the amplified I, Q signals and the oscillation signal φRF2 generated by the oscillation circuit VCO2, and an amplifier 233 for amplifying the modulated signal.

This embodiment is configured of a RF-PLL 1 for generating the radio-frequency signal φRF1 combined with the receiving signal by the mixer 212 and a RF-PLL 2 for generating the radio-frequency signal φRF2 combined with the transmission signal by the mixer 233. As the VCO and the reference oscillation circuit 250 in these PLLs, the power supply-integrated oscillation circuit described in the first to third embodiments is used.

The RF-PLL 1 includes a VCO 221, an automatic band select circuit 222 for selecting the operating band of the VCO, a variable frequency divider 223 for dividing the frequency of the oscillation signal generated by the VCO 221, and a frequency divider 224 for dividing the frequency of the reference clock φref from the reference oscillation circuit 250. The RF-PLL 1 further includes a phase comparators 225 for comparing the phases of the signals divided by the frequency dividers 223, 224, a charge pump 226 for generating a voltage corresponding to the phase difference, and a loop filter 227. The charge voltage of the loop filter 227 is applied to the VCO 221 as an oscillation control voltage Vctr. The RF-PLL 2, on the other hand, has the same configuration as the RF-PLL 1 except for the frequency of the radio-frequency signal generated, and therefore is not shown nor described.

Though not specifically limited, according to this embodiment, the reference oscillation circuit 250 for generating the reference clock φref required by the RF-PLL 1 at receiving end and the RF-PLL 2 at transmitting end is shared by the receiving and transmission systems. Also, the RF-PLL 1 and the RF-PLL 2 include control circuits 261, 262 for generating signals for controlling the RF-PLL 1 and the RF-PLL 2, the receiving and transmission system circuits based on the signal from the baseband circuit 300.

The control circuits 261, 262 each include a control register and a data register. The offset value and the oscillation frequency (frequency dividing ratio) described above are set in these registers based on the signals from the baseband IC 300, and the values set in the registers are supplied to the registers in the automatic band select circuit 222 of the RF-PLL 1, RF-PLL 2 and the variable frequency dividing circuit 223.

At the same time, based on a command (command code, etc.) from the baseband IC 300, an oscillation frequency switching control signal is applied to the automatic band select circuit 222 from the control circuits 261, 262. The control circuit may be shared by the RF-PLL 1, RF-PLL 2 or by the receiving system circuit and the transmission system circuit.

The invention achieved by the inventor is explained specifically above according to embodiments. This invention, however, is not limited to these embodiments, and of course can be variously modified without departing from the scope and spirit thereof.

The current source circuit 11, the VCO 20 and the regulator circuit (MO) disclosed in the first to third embodiments and the modifications can be combined with each other arbitrarily. Also, in the case where the use of what is called the BiCMOS process is permitted, a mixture circuit can be implemented in which the transistors making up the VCO 20 or the transistors making up the current source circuit 11 can be formed of MOSFETs and the other of bipolar transistors.

Also, according to this embodiment, a circuit is employed using the VCO in which the frequency of the oscillation signal generated can be changed by the control voltage Vctr. Nevertheless, the VCO with a fixed frequency of the oscillation signal can be used with equal effect.

The foregoing description mainly deals with the invention achieved by the inventor in terms of the VCO embedded in the radio-frequency IC of the radio communication devices such as the mobile phone as an application providing the background of the invention. Nevertheless, this invention is not limited to this application but generally applicable widely to all the VCOs embedded in the semiconductor integrated circuit.

The invention claimed is:

1. An oscillation circuit formed in a single semiconductor chip, comprising:
a first power supply terminal supplied with a first source voltage;
a second power supply terminal supplied with a second source voltage different from the first source voltage;
a voltage regulator for receiving a voltage from the first power supply terminal and outputting a source voltage; and
a voltage controlled oscillation circuit supplied with the source voltage from the voltage regulator; and
a current source circuit connected to the second power supply terminal;
wherein the voltage regulator, the voltage controlled oscillation circuit and the current source circuit are connected in series between the first and second power supply terminals, and the current supplied from the voltage regulator to the voltage controlled oscillation circuit flows in the current source circuit.

2. An oscillation circuit according to claim 1,
wherein the current source circuit includes a reference voltage generating circuit, and
wherein the voltage regulator includes a power supply control transistor for receiving at a control terminal thereof the output voltage of an output comparison differential amplifier circuit of the reference voltage generating circuit and decreasing a first source voltage thereby to generate the operating voltage of the voltage controlled oscillation circuit.

3. An oscillation circuit according to claim 1,
wherein the reference voltage generating circuit includes
a first current path having a first resistor and a first transistor inserted in series between the connecting point of the voltage controlled oscillation circuit and the second power supply voltage terminal,
a second current path having a second resistor, a third resistor and a second transistor inserted in series between the connecting point of the voltage controlled oscillation circuit and the second power supply voltage terminal, and
an output comparison differential amplifier circuit supplied with two voltages generated by the voltage drop of the first resistor and the second resistor and outputting a voltage corresponding to the potential difference between the two voltages.

4. An oscillation circuit according to claim 3,
wherein in said first, second and third resister the potential at the connecting point between the reference voltage generating circuit and the voltage controlled oscillation circuit has a positive temperature characteristic, and
wherein the resistance value is set in such a manner as to cancel the negative temperature characteristic of the transistors in the oscillation circuit.

5. An oscillation circuit according to claim 4,
wherein the voltage controlled oscillation circuit includes selected one of a pair of bipolar transistors connected to a common emitter with the base terminal and the collector terminal cross-connected and a pair of field effect transistors connected to a common source with the gate terminal and the drain terminal cross-connected, and
wherein the voltage generated by the voltage regulator is higher than the potential at the connecting node by an amount corresponding to selected one of the base-emitter voltage of the bipolar transistor and the gate-source voltage of the field effect transistor.

6. An oscillation circuit according to claim 4,
wherein the voltage controlled oscillation circuit includes a pair of bipolar transistors having a common emitter with the base terminals and the collector terminals thereof cross-connected with each other, and
wherein a resistor is inserted between the base terminal and the collector terminal and between the base terminal and the emitter terminal of the pair of the bipolar transistors, respectively, and
wherein the voltage divided by the resistors is applied to the base terminals of the bipolar transistors for self biasing.

7. An oscillation circuit according to claim 5,
wherein the transconductance (Gm) of selected one of the bipolar transistor pair and the field effect transistor pair of the voltage controlled oscillation circuit is temperature-compensated by the current flowing in the reference voltage generating circuit and having a positive temperature coefficient.

8. An oscillation circuit according to claim 5,
wherein the voltage controlled oscillation circuit is an LC resonance-type oscillation circuit including a pair of inductance elements inserted between selected one of the bipolar transistor pair and the field effect transistor pair and the power control transistor, and a capacitor inserted between the collector terminals of the bipolar transistor pair or between the drain terminals of the field effect transistor pair.

9. An oscillation circuit according to claim 8,
wherein the voltage-controlled oscillation circuit includes
a pair of varactor diodes with the cathode terminals thereof arranged in opposed relation to each other between the collector terminals of the bipolar transistor pair or between the drain terminals of the field effect transistor pair, and
a pair of capacitors connected between the connecting nodes of the anode terminals of the varactor diode pair and selected one of the collector terminals of the bipolar transistor pair and the drain terminals of the field effect transistor pair, respectively, and
wherein the oscillation frequency is changed by applying a control voltage to the common cathode terminal of the varactor diode pair.

10. An oscillation circuit according to claim 1,
wherein the current source circuit includes
a first current path having a first resistor and a first transistor inserted in series between the connecting point of the voltage controlled oscillation circuit and the second source voltage terminal,
a second current path having a second resistor and a third resistor inserted in series between the connecting point of the voltage controlled oscillation circuit and the second source voltage terminal, and
an output comparison differential amplifier circuit supplied with two voltages generated by the voltage drops through the first resistor and the second resistor and outputting a voltage corresponding to the potential difference between the two voltages, and
wherein the voltage regulator includes a power control transistor for generating a source voltage of the voltage controlled oscillation circuit by receiving the output voltage of the output comparison differential amplifier circuit at the control terminal thereof and decreasing the input source voltage.

\* \* \* \* \*